United States Patent
Sawa et al.

[11] Patent Number: 5,978,221
[45] Date of Patent: *Nov. 2, 1999

[54] RADIATING SPACER, ITS USE AND SILICONE COMPOSITION

[75] Inventors: Hiroaki Sawa; Masato Nishikawa; Mikitoshi Sato; Kazuyoshi Ikeda, all of Omuta, Japan

[73] Assignee: Denki Kagaku Kogyo Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/848,197

[22] Filed: Apr. 29, 1997

[30] Foreign Application Priority Data

Apr. 30, 1996 [JP] Japan ..................... 8-130611
Apr. 30, 1996 [JP] Japan ..................... 8-130612

[51] Int. Cl.$^6$ ........................... H05K 7/20
[52] U.S. Cl. .................. 361/704; 165/185; 174/16.3; 252/74; 361/719; 428/313.5
[58] Field of Search ............... 361/717–719, 361/704–710; 174/16.3, 252; 165/80.3, 185; 428/313.5, 319.3, 325, 327–331, 402.21, 403, 404, 421, 422, 447, 450, 901; 257/706, 720; 242/74, 73

[56] References Cited

U.S. PATENT DOCUMENTS

| | | |
|---|---|---|
| 4,960,612 | 10/1990 | Dentini et al. . |
| 5,008,307 | 4/1991 | Inomata ................. 523/220 |
| 5,014,777 | 5/1991 | Sano . |
| 5,060,114 | 10/1991 | Feinberg et al. . |
| 5,406,025 | 4/1995 | Carlstedt . |
| 5,591,034 | 1/1997 | Ameen . |
| 5,679,457 | 10/1997 | Bergerson . |
| 5,738,936 | 4/1998 | Hanrahan . |

FOREIGN PATENT DOCUMENTS

| | | |
|---|---|---|
| 0 114 000 | 7/1984 | European Pat. Off. . |
| 2 570 383 | 3/1986 | France . |
| 2-196453 | 8/1990 | Japan . |
| 6-155517 | 6/1994 | Japan . |
| 6-291226 | 10/1994 | Japan . |
| 7-19232 | 1/1995 | Japan . |
| 7-238177 | 9/1995 | Japan . |
| 2 270 207 | 3/1994 | United Kingdom . |

OTHER PUBLICATIONS

Patent Abstracts of Japan, vol. 004, No. 137 (E–027), Sep. 25, 1980, JP 55–088357, Jul. 4, 1980.

Patent Abstracts of Japan, vol. 097, No. 001, Jan. 31, 1997, JP 08–236973, Sep. 13, 1996.

*Primary Examiner*—Gerald Tolin
*Attorney, Agent, or Firm*—Oblon, Spivak, McClelland, Maier & Neustadt, P.C.

[57] ABSTRACT

A radiating spacer consisting essentially of a silicone solidified product containing a heat conductive filler, said spacer having a thermal conductivity of at least 0.8 W/m·K and a compressibility of at least 10% under a load of 30 g/cm$^2$.

8 Claims, 1 Drawing Sheet

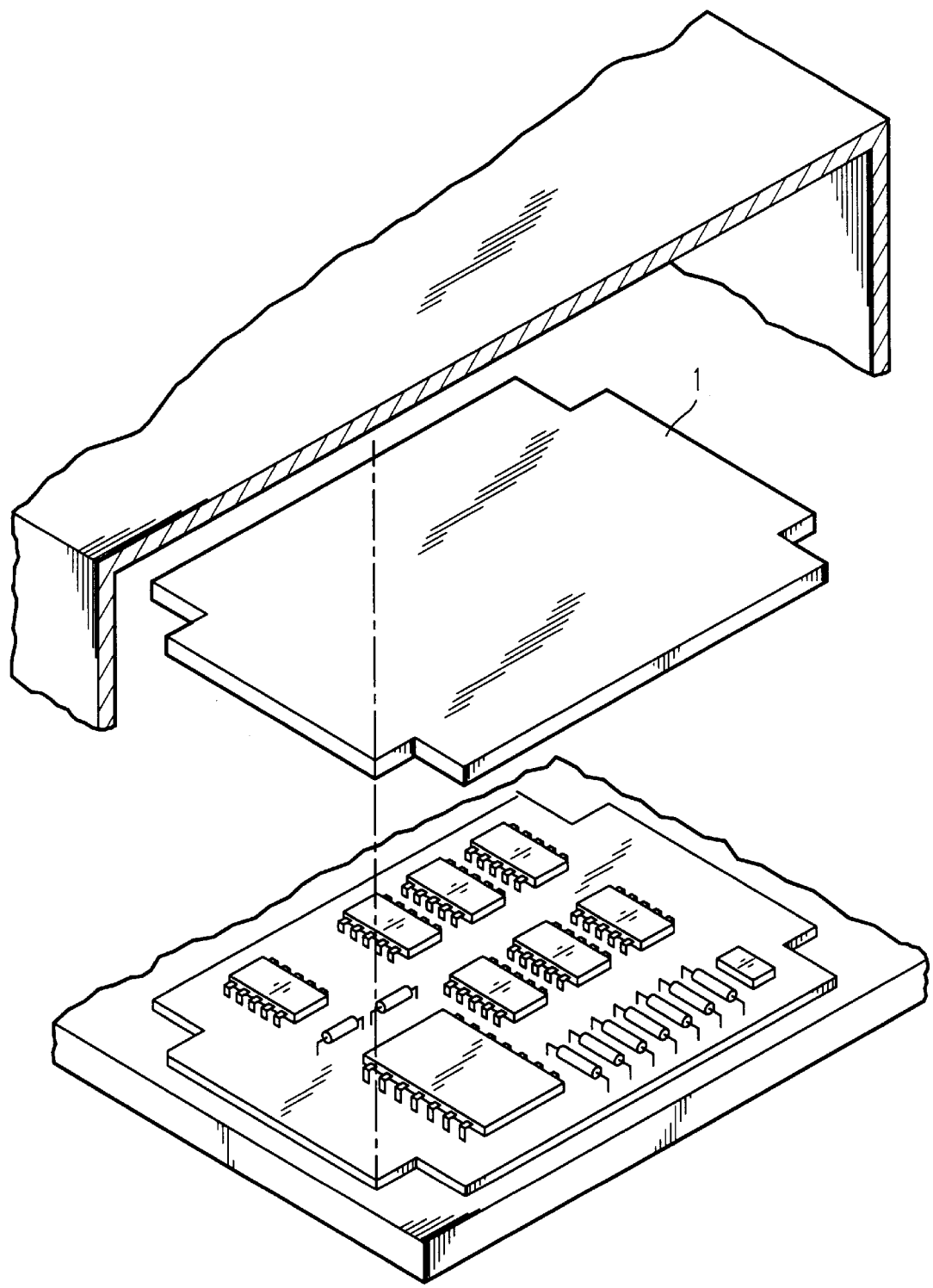

RADIATING SPACER, ITS USE AND SILICONE COMPOSITION

BACKGROUND OF THE INVENTION

1. Field of the Invention

The present invention relates to a radiating spacer which has high flexibility and which, when incorporated in an electronic equipment, reduces a load to a heat-generating element, a heat sink employing such a spacer, a radiating spacer part material, an electronic equipment, and a silicone composition.

2. Description of the Background

A heat-generating electronic part such as a transistor or a thyristor generates a heat during its use, and it is important to remove such heat. Heretofore, as a method for removing the generated heat, it has been common to remove the heat by attaching the heat-generating electronic part to a radiating fin or a metal plate with an electrically insulating heat conductive sheet interposed therebetween. As such a heat conductive sheet, a radiation sheet having a heat conductive filler loaded to silicone rubber has been mainly employed.

On the other hand, along with recent high densification of electronic equipments, a system of conducting the heat generated from a heat-generating electronic part directly to a casing of the electronic equipment, may be employed in a case where no space for attaching a radiating fin or the like is available or in a case where an electronic equipment is sealed in so that heat dissipation from the radiating fin located inside to the exterior, is difficult. To carry out such heat conduction, a highly flexible radiating spacer may be employed which has a thickness to fill out the space between the heat-generating electronic part and the casing.

Further, a highly flexible radiating spacer may also be employed between a printed board and a radiating fin for heat dissipation in a case where IC or LSI heat-generating electronic part is mounted on the printed board.

However, conventional radiating sheets commonly employed, are hard with a Shore hardness of at least 90 and accordingly poor in the shape-trailing property. Accordingly, there has been a problem that when such a radiating sheet is pressed against a heat-generating electronic part for close contact, the heat-generating electronic part which is weak against stress is likely to break.

Therefore, a radiating spacer more flexible than a radiating sheet has been developed. However, even then, in a case where the heat-generating electronic part to be contacted with the radiating spacer, is extremely weak against stress, the heat-generating electronic part is likely to break when the radiating spacer is brought in close contact therewith and a load is exerted thereto. Thus, a problem of breakage has not yet been solved.

Along with high densification of electronic equipments, the shape-trailing property has been required more than ever, and a radiating spacer having higher flexibility has now been desired. However, if the material for a radiating spacer is designed to meet such requirement, its surface usually tends to have high adhesiveness. This adhesiveness not only impairs the operation efficiency but also causes deterioration of the thermal conductivity due to adhesion of dust from the atmosphere on the surface of the material, although it may be effective for temporal tacking of the material itself.

SUMMARY OF THE INVENTION

The present invention has been made in view of the above background, and it is an object of the present invention to provide a radiating spacer which has high flexibility and high thermal conductivity and which is excellent in handling efficiency with adhesion-suppressing treatment applied thereto, a heat sink employing such a spacer, a radiating spacer part material, an electronic equipment, and a silicone composition.

Namely, the present invention provides a radiating spacer consisting essentially of a silicone solidified product containing a heat conductive filler, said spacer having a thermal conductivity of at least 0.8 W/m·K and a compressibility of at least 10% under a load of 30 g/cm$^2$. The radiating spacer preferably has at least a part of its surface treated by adhesion-suppressing treatment.

The present invention also provides a heat sink comprising a metal sheet and at least one radiating spacer as defined above laminated on one side or both sides of the metal sheet.

The present invention further provides a radiating spacer part material comprising a packaging material and radiating spacers as defined above arranged on the packaging material.

Further, the present invention provides an electronic equipment comprising a circuit board having a heat-generating electronic part mounted thereon, a radiating part, and a radiating spacer as defined above interposed between the circuit board and the radiating part.

Still further, the present invention provides a silicone composition comprising from 55 to 95 vol % of a two-part addition reactive silicone and from 5 to 45 vol % of a heat conductive filler, a solidified product of the silicone composition having a thermal conductivity of at least 0.8 W/m·K and a compressibility of at least 10% under a load of 30 g/cm$^2$.

Now, the present invention will be described in detail with reference to the preferred embodiments.

The radiating spacer of the present invention consists essentially of a silicone solidified product containing a heat conductive filler and has a thermal conductivity of at 0.8 W/m·K and a compressibility of at least 10% under a load of 30 g/cm$^2$.

BRIEF DESCRIPTION OF THE DRAWINGS

The FIGURE shows an embodiment of the invention showing the use of a radiation spacer (1) of the invention incorporated as a component of a device containing a circuit board.

The silicone solidified product of the present invention has high flexibility, and an addition reactive silicone solidified product may be mentioned as its specific example. As a specific example of this addition reactive silicone, a one-pack silicone having both a vinyl group and a H-Si group in one molecule, or a two-part silicone comprising an organopolysiloxane having a vinyl group at its terminal or side chain and an organopolysiloxane having at least two H-Si groups at its terminals or side chains, may be mentioned. As a commercial product of such an addition reactive silicone, "CY52-283A/B", tradename, manufactured by TORAY DOW-CORNING K.K., may, for example, be mentioned. The flexibility of the silicone solidified product can be adjusted by the crosslinking density formed by the addition reaction or by the amount of the heat conductive filler to be incorporated to the silicone solidified product.

The content of silicone contained in the radiating spacer of the present invention varies depending upon the type of the heat conductive filler, but it is usually from 55 to 95 vol %, preferably from 60 to 90 vol %, more preferably from 65 to 80 vol %, in the radiating spacer. If the content is less than 55 vol %, the flexibility of the radiating spacer tends to be inadequate, and if it exceeds 95 vol %, the thermal conductivity tends to be low, and the adhesiveness tends to be so high that the handling efficiency tends to be poor.

The heat conductive filler to be used in the present invention serves to impart thermal conductivity to the radiating spacer, and its thermal conductivity can be adjusted by the type and the content of the heat conductive filler. As the heat conductive filler, one or more members may be selected for use from a group consisting of boron nitride (hereinafter referred to as BN), silicone nitride, aluminum nitride, alumina and magnesia, in a case where an insulating property is required, or from a group consisting of aluminum, copper, silver, gold and silicon carbide in a case where an insulating property is not required.

The shape of the heat conductive filler may be any shape such as a spherical, powdery, fiber-like, needle-like or scaly shape. The particle size is usually within a range of from 1 to 100 $\mu$m as an average particle size.

The content of the heat-conductive filler may vary depending upon the type of the heat conductive filler, but is usually from 5 to 45 vol %, preferably from 10 to 40 vol %, more preferably from 20 to 35 vol %, in the radiating spacer. If the content is less than 5 vol %, the thermal conductivity tends to be inadequate, and if it exceeds 45 vol %, the flexibility as a radiating spacer tends to be lost, such being undesirable.

As a heat conductive filler suitable for the present invention, it is preferred to load BN in a large amount from the viewpoint of the thermal conductivity, since higher thermal conductivity can be obtained at the same loading ratio. However, from the viewpoint of the hardness, it is preferred to load alumina or magnesia, since a more flexible silicone solidified product can be obtained at the same loading ratio. It is particularly preferred to mix a plurality of fillers rather than using a single filler. As a suitable blend ratio, the mixing ratio of BN to alumina or magnesia is preferably from 1:0.5 to 1:12, more preferably from 1:2 to 1:9, by volume ratio.

The thermal conductivity of the radiating spacer of the present invention is at least 0.8 W/m·K, preferably at least 1.5 W/m·K.

An example of the method for producing the radiating spacer of the present invention will be described. A heat-conductive filler is mixed to a one-pack silicone or two-part silicone comprising an organopolysiloxane having a vinyl group at its terminal or side chain and an organopolysiloxane having at least two H-Si groups at its terminals or side chains, to obtain a slurry. Then, the slurry is cast into a mold made of e.g. a fluorine resin, put in a vacuum drier, defoamed at room temperature and then heated to solidify the silicone, followed by cooling, and removed from the mold to obtain a radiating spacer. If necessary, after removed from the mold, the radiating spacer may further be subjected to heat treatment.

In the above described production method, the molding method is not particularly limited. However, in a case where molding is carried out by casting a slurry comprising a silicone and a heat conductive filler, the viscosity of the slurry is preferably low at a level of not higher than 20,000 cps. In a case where molding is carried out by extrusion molding, the viscosity of the slurry is preferably at a level of at least 100,000 cps. For thickening, ultrafine silica powder (such as aerosil, manufactured by Nippon Aerosil K.K.) or silicone powder of from some ten to some hundreds $\mu$m, may be employed.

When the radiating spacer of the present invention is formed into a sheet, the thickness is usually from 0.5 to 20 mm, preferably from 1 to 6 mm. Further, its planar or sectional shape may be any shape without any particular restriction. For example, a polygonal shape such as a triangular, tetragonal or pentagonal shape, a circular shape or an oval shape may be mentioned. Further, its surface may be spherical.

In the present invention, the compressibility is meant for the deformation ratio in the pressing direction when a predetermined load is exerted to the radiating spacer.

The radiating spacer of the present invention, has a compressibility of at least 10%, preferably from 15 to 50%, more preferably from 20 to 40%, under a load of 30 g/cm$^2$, and if the load is removed, it returns to the initial shape. Thus, it has extremely high flexibility and elasticity and presents a nature like a marshmallow. Even if such a radiating spacer is pressed against a heat-generating electronic part which is very weak against stress, the possibility of damaging the heat-generating electronic part can be minimized. Further, even in a case where heat-generating electronic parts are densely disposed, such a radiating spacer presents an adequate shape-trailing property.

Further, the radiating spacer of the present invention preferably has at least a part of the surface of the above silicone solidified product treated by an adhesion-suppressing treatment also from the viewpoint of practical use. As a method for the adhesion-suppressing treatment, a ceramic powder coating method, an active substance coating and curing method or an ultraviolet ray radiation method may, for example, be mentioned.

The ceramic powder to be used for the ceramic powder coating method may suitably be the above mentioned superfine powder of heat conductive filler or talc, and such a ceramic powder is sprayed on the surface of the silicone solidified product to carry out the adhesion-suppressing treatment.

As the method for coating and curing an active substance to form an adhesion-suppressing coating film, a method may, for example, be mentioned wherein an active substance such as an organic peroxide, an isocyanate, a platinum type-catalyst-containing polyorganosiloxane or an organosilane, is coated on the surface of the silicone solidified product, followed by heat-curing.

As the method for forming an adhesion-suppressing coating film by an ultraviolet ray radiation method, there is no particular limitation, but a method may be mentioned wherein a short wave ultraviolet ray is irradiated from a short distance.

The portion of the radiating spacer of the present invention to be treated for adhesion-suppression, is at least a part of the surface of the silicone solidified product containing the heat conductive filler, preferably a part which is in contact with fingers at the time of handling. Specifically, at least two surfaces of the silicone solidified product, such as the top surface and the side surface, or side surfaces, may be treated. In such a case, the adhesion-suppressing treatment may be applied to a part or whole of each of such surfaces.

The radiating spacer of the present invention can be treated for suppressing adhesion or tackiness of the surface, whereby the handling can be facilitated, and the operation efficiency will be improved.

Further, the present invention provides a radiating spacer part material having the above mentioned radiating spacers arranged on a packaging material. With the radiating spacer part material of the present invention, the adhesiveness of the portion other than the contacting face of the radiating spacers with the packaging material, is suppressed to such an extent that there will be no practical problem, whereby adhesion of dust during transportation or storage can be prevented. Further, it is thereby possible to eliminate inconveniences in handling due to the flexibility or elongation of the radiating spacers.

As the packaging material to be used in the present invention, a plastic or metal tray, or a paper or plastic carrier tape is suitable. If a packaging material has a release property, such a packaging material may be used by itself. However, in a case where it has no release property, a releasing agent may be coated thereon before use. The radiating spacers can thereby be readily released from the packaging material, whereby the efficiency in pasting operation of the radiating spacers can be substantially improved.

The radiating spacers arranged on the above packaging material have adhesiveness and accordingly can easily be arranged without using any adhesive.

The present invention also provides a heat sink having at least one radiating spacer as described above laminated on one side or both sides of a metal sheet.

The laminated state of the radiating spacer is not particularly limited and may freely be selected depending upon the particular purpose. For example, one or more radiating spacers having the same or different sizes may be laminated on a part or on the entire surface of the front side or rear side of the metal sheet. Otherwise, a plurality of radiating spacers may be laminated in a U-shape along the edge of three sides among the four sides of the metal sheet in equal or optional distances.

The metal sheet may be any metal sheet, such as an aluminum, copper, iron, stainless steel or enameled sheet. Particularly preferred is an aluminum sheet. The thickness of the metal sheet is preferably from 0.3 to 6 mm.

Such a heat sink of the present invention has the surface other than contact face of the radiating spacer with the metal treated for adhesion-suppression and thus is easy for handling, and it can be used as directly attached to a circuit board having a heat-generating electronic part mounted thereon.

The electronic equipment of the present invention comprises a circuit board having a heat-generating electronic part mounted thereon, a radiating part, and a radiating spacer as described above interposed between the circuit board and the radiating part.

The radiating part may, for example, be a heat sink, a radiating fin or a metal, ceramic or plastic casing. Examples of the ceramics include aluminum nitride, BN, silicon carbide, alumina and silicon nitride, and the plastics include, for example, polyvinyl chloride, polystyrene, polypropylene, polyethyleneterephthalate, polycarbonate and ABS resin.

Types of the electronic equipments include, for example, computers, CD-ROM drives, DVD drives, CD-R drives and portable telephones.

Further, the silicone composition of the present invention can be used not only for the above mentioned radiating spacer for an electronic part, but also as a buffer in a case where it is desired to heat an object without exerting a stress thereto, or as a buffer in a case where it is desired to contact two objects directly in order to bring them to an equal temperature but at the same time, it is desired to avoid an influence of a stress or vibration.

Now, the present invention will be described in further detail with reference to Examples and Comparative Examples. However, it should be understood that the present invention is by no means restricted to such specific Examples.

EXAMPLES 1 to 8

Two-part type addition reactive silicones ("CY52-283", tradename, manufactured by TORAY DOW-CORNING K.K.) comprising liquid A (organopolysiloxane having vinyl groups) and liquid B (organopolysiloxane having H-Si groups) were mixed in the proportions (vol %) as shown in Table 1, and alumina powder having an average particle size of 17 μm ("AS-30", tradename, manufactured by Showa Denko K.K.), BN powder having an average particle size of 15 μm ("Denkaboron Niride", tradename, manufactured by Denki Kagaku Kogyo K.K.) and magnesia powder having an average particle size of 18 μm ("Pirochisma 3320K", tradename, manufactured by Kyowa Chemical Industry Co., Ltd.) were mixed thereto in the proportions (vol %) as shown in Table 1 to obtain a slurry (viscosity: about 8000 cps). The slurry was cast into a fluorine resin mold (5 mm×50 mm×50 mm).

Then, the mold was put in a vacuum drier, and after defoaming at room temperature, it was heated at 150° C. for one hour to solidify the silicone. Then, the molded product was taken out from the mold and further heated at 150° C. for 24 hours to obtain a radiating spacer made of a silicone solidified product (1 to 5 mm×50 mm×50 mm).

As adhesion-suppressing treatment, the following method was applied to the surface of the radiating spacer.

(A) Powder coating method

The entire surface of the radiating spacer except for the lower surface, BN powder having an average particle size of 3 μm ("Denka Boron Niride", tradename, manufactured by Denki Kagaku Kogyo K.K.) was uniformly coated.

(B) Active substance coating and curing method

On one side of the radiating spacer, a mineral oil solution of 2,4-dichlorobenzoyl peroxide was coated and heated at 150° C. for 15 minutes to carry out adhesion-suppressing treatment of the surface.

(C) Ultraviolet ray radiation method

On one side of the radiating spacer, ultraviolet rays were irradiated for 60 seconds from an ultraviolet lamp at a distance of 15 cm.

Comparative Example 1

Two-part type addition reactive silicones ("CY52-283", tradename, manufactured by TORAY DOW-CORNING K.K.) comprising liquid A (organopolysiloxane having vinyl groups) and liquid B (organopolysiloxane having H-Si groups) were mixed in the mixing ratio of liquid A to liquid B of 50/50 (vol %), and a radiating spacer was prepared in the same manner as in Example 1 except that no heat conductive filler was incorporated.

Comparative Example 2

Two-part type addition reactive silicones ("CY52-283", tradename, manufactured by TORAY DOW-CORNING K.K.) comprising liquid A (organopolysiloxane having vinyl groups) and liquid B (organopolysiloxane having H-Si groups) were mixed in the mixing ratio of liquid A to liquid B of 26/26 (vol %), and a radiating spacer was prepared in the same manner as in Example 1 except that as a heat conductive filler, 48 vol % of alumina powder having an average particle size of 17/μm ("AS-30", tradename, manufactured by Showa Denko K.K.) was mixed.

Test Methods

(1) Compressibility

A load of 30 g was exerted to a 1 cm² portion of the radiating spacer in the thickness direction by means of a precision universal tester ("Autograph", tradename, Shimazu Corporation), and the compressibility was calculated by the following formula (1):

$$\text{Compressibility}(\%) = \frac{\text{Compression deformation (mm)}}{\text{Initial thickness (mm)}} \times 100 \quad (1)$$

(2) Thermal conductivity

A radiating spacer was sandwiched between a TO-3 type copper heater casing and a copper plate and set under a clamping torque of 200 g-cm by a torque wrench. Then, a power of 5 W was applied to the copper heater casing for 4 minutes, whereupon the temperature difference (° C.) between the copper heater casing and the copper plate was measured, and the thermal resistance (° C./W) was calculated by the following formula (2). Using this thermal resistance, the thermal conductivity (W/m·K) was calculated by the following formula (3).

$$\text{Thermal resistance (°C. / W)} = \frac{\text{Temperature difference (°C.)}}{\text{Power (W)}} \quad (2)$$

$$\text{Thermal conductivity}(W/m \cdot K) = \frac{1}{\text{Thermal resistance}(K/W)} \times \frac{\text{Thickness}}{\text{Measured area (m}^2)} \quad (3)$$

(3) Adhesiveness

The adhesiveness of the sample surface was evaluated by touching with a finger.

○: The sample did not adhere to the finger.

x: The sample adhered to the finger and was lifted as adhered.

The results are shown in Table 1.

TABLE 1

| Components: vol % | Examples |  |  |  |
|---|---|---|---|---|
|  | 1 | 2 | 3 | 4 |
| Silicone liquid A | 42 | 46 | 42 | 45 |
| Silicone liquid B | 28 | 30 | 28 | 30 |
| Alumina powder | 25 | 19 | 30 | 0 |
| BN powder | 5 | 5 | 0 | 25 |
| Magnesia powder | 0 | 0 | 0 | 0 |
| Adhesion-suppressing treatment | Ultraviolet | Ultraviolet | Powder coating | Active substance |
| Spacer thickness (mm) | 5.0 | 1.0 | 5.0 | 5.0 |
| Compressibility (%) | 20 | 15 | 24 | 15 |
| Thermal conductivity (W/m · K) | 2.0 | 0.9 | 1.8 | 2.2 |
| Adhesiveness | ○ | ○ | ○ | ○ |

| Components: vol % | Examples |  |  |  | Comparative Examples |  |
|---|---|---|---|---|---|---|
|  | 5 | 6 | 7 | 8 | 1 | 2 |
| Silicone liquid A | 45 | 42 | 42 | 45 | 50 | 26 |
| Silicone liquid B | 30 | 28 | 28 | 30 | 50 | 26 |
| Alumina powder | 0 | 25 | 30 | 0 | 0 | 48 |
| BN powder | 0 | 5 | 0 | 25 | 0 | 0 |
| Magnesia powder | 25 | 0 | 0 | 0 | 0 | 0 |
| Adhesion-suppressing treatment | Nil | Nil | Nil | Nil | Nil | Nil |
| Spacer thickness (mm) | 5.0 | 5.0 | 5.0 | 5.0 | 5.0 | 5.0 |
| Compressibility (%) | 33 | 20 | 24 | 15 | 64 | 8 |
| Thermal conductivity (W/m · K) | 2.0 | 2.0 | 1.8 | 2.2 | 0.2 | 2.5 |
| Adhesiveness | X | X | X | X | X | X |

It is evident from the results of Table 1 that the radiating spacer of the present invention is highly flexible with a compressibility of as large as from 15% to 33% under a load of 30 g/cm², and it has excellent thermal conductivity at a level of at least 0.8 W/m·K. Further, the adhesiveness of the surface can be suppressed to such an extent that there will be no practical problem.

Comparative Example 9

The radiating spacer (5 mm×50 mm×50 mm) obtained in the same manner as in Example 1 or Example 6 was laminated on an aluminum plate (3 mm×52 mm×52 mm) to prepare a heat sink. The radiating spacer had adhesiveness on the contacting face with the aluminum plate, and it readily adhered and was laminated on the aluminum plate. The obtained heat sink was useful as a radiating plate for a circuit board having a heat-generating electronic part mounted thereon. Further, the radiating spacer of Example 1 had adhesion-suppressing treatment applied on its surface and therefore the handling efficiency was good without sticking to a finger.

Comparative Example 10

Radiating spacers (5 mm×50 mm×50 mm) obtained in the same manner as in Example 1 or 6 were arranged on a tape-shaped polyethylene tetrafluoride film having a width of 60 mm and having a release property, to obtain a radiating spacer part material. The radiating spacers could readily be peeled from the film, and were convenient for handling. Further, the radiating spacers of Example 1 had adhesion-suppressing treatment applied to the finger contacting surface, and they were easy to handle without sticking to a finger.

As described in the foregoing, the radiating spacer of the present invention is excellent in the thermal conductivity and flexibility, and even when pressed against a circuit board having a heat-generating electronic part mounted thereon, it exerts no substantial stress. Further, it is capable of carrying out heat dissipation of a circuit board having highly densified heat-generating electronic parts mounted thereon, while maintaining good contact. Further, the spacer having adhesion-suppressing treatment applied to the surface provides excellent handling efficiency in addition to high flexibility. By changing the adhesion-suppressing layer formed on the surface of the radiating spacer, it is also possible to adjust the thermal conductivity and flexibility.

The heat sink of the present invention can be used by itself as a radiating plate for a circuit board having a heat-generating electronic part mounted thereon.

According to the radiating spacer part material of the present invention, handling efficiency of the radiating spacers and the operation efficiency can be improved.

The electronic equipment of the present invention is excellent in the heat dissipation property and free from breakage of a heat-generating electronic part.

Further, the silicone composition of the present invention is useful as a buffer in a case where it is desired to heat an object without exerting a stress thereto, or as a buffer in a case where it is desired to contact two objects directly in order to bring the objects to an equal temperature, and at the same time it is desired to avoid an influence of a stress or vibration.

What is claimed is:

1. A radiation spacer, comprising:

a shaped product of particulate heat conductive inorganic compound or metal having an average particle size ranging from 1 to 100 μm blended in a one-pack or a two-pack silicone material, said shaped product having a thermal conductivity of at least 0.8 W/m·K and a compressibility of at least 10% under a load of 30 g/cm$^2$, wherein said particulate heat conductive material comprises an essential component of BN and a component selected from the group consisting of $Si_3N_4$, AlN, $Al_2O_3$, MgO, Al, Cu, Ag, Au and SiC, and at least a portion of the surface of the irradiating spacer is treated so that its adhesivity is suppressed.

2. The irradiating spacer according to claim 1, wherein said one-pack silicone has vinyl and Si-H groups or said two-pack silicone comprises an organopolysiloxane containing terminal or side chain vinyl groups and an organopolysiloxane having at least 2 terminal or side chain Si-H groups.

3. The irradiating spacer according to claim 2, wherein the silicone content of the spacer ranges from 55 to 95 vol. % and the content of the particulate heat conductive inorganic compound or metal ranges from 5 to 45 vol. %.

4. The irradiating spacer according to claim 3, wherein the silicone content of the spacer ranges from 60–90 vol. % and the content of the particulate heat conductive inorganic compound or metal ranges from 10–40 vol. %.

5. A heat sink comprising a metal plate and at least one radiating spacer as defined in claim 1 laminated on one side or both sides of the metal plate.

6. A radiating spacer part material comprising a packaging material and radiating spacers as defined in claim 1 arranged on the packaging material.

7. An electronic equipment comprising a circuit board having a heat-generating electronic part mounted thereon, a radiating part, and a radiating spacer as defined in claim 1 interposed between the circuit board and the radiating part.

8. A silicone composition comprising from 55 to 95 vol % of a two-part addition reactive silicone and from 5 to 45 vol % of a particulate heat conductive filler, a solidified product of the silicone composition having a thermal conductivity of at least 0.8 W/m·K and a compressibility of at least 10% under a load of 30 g/cm$^2$.

* * * * *